US 6,291,897 B1

(12) United States Patent
Wark et al.

(10) Patent No.: US 6,291,897 B1
(45) Date of Patent: Sep. 18, 2001

(54) CARRIERS INCLUDING PROJECTED CONTACT STRUCTURES FOR ENGAGING BUMPED SEMICONDUCTOR DEVICES

(75) Inventors: James M. Wark; Salman Akram, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/305,493

(22) Filed: May 5, 1999

Related U.S. Application Data

(63) Continuation of application No. 08/828,255, filed on Mar. 26, 1997, now Pat. No. 5,929,521.

(51) Int. Cl.⁷ .............................. H05K 3/00; H01L 23/48; H01L 29/46; H01L 23/52
(52) U.S. Cl. ..................... 257/786; 257/784; 257/797; 257/737; 257/738; 257/779; 257/773; 257/782; 257/618; 257/449; 257/734; 257/778; 257/692; 29/842; 29/846
(58) Field of Search .................. 257/737, 738, 257/780, 778–790, 692, 669, 673, 674, 782, 783, 734, 797, 618, 773; 29/842, 846

(56) References Cited

U.S. PATENT DOCUMENTS

| Re. 27,934 | 3/1974 | Merrin et al. ................. 257/737 |
| 3,202,888 | 8/1965 | Evander et al. ............... 257/738 |
| 4,263,606 | 4/1981 | Yorikane ....................... 257/737 |
| 4,390,771 | 6/1983 | Kurtz et al. ................. 219/56.22 |
| 4,597,519 | 7/1986 | Kurtz et al. ................... 228/102 |
| 4,804,132 | 2/1989 | DiFrancesco .................. 228/115 |
| 5,207,585 | 5/1993 | Byrnes et al. .................. 439/66 |
| 5,214,308 | 5/1993 | Nishiguchi et al. ............ 257/738 |
| 5,329,423 | 7/1994 | Schulz .......................... 257/738 |
| 5,373,111 | 12/1994 | McClure et al. ............... 174/250 |
| 5,426,266 | 6/1995 | Brown et al. .................. 174/267 |
| 5,428,298 | 6/1995 | Ko ................................ 324/747 |
| 5,457,344 | 10/1995 | Bartelink ...................... 257/737 |
| 5,508,561 | 4/1996 | Tago et al. .................... 257/738 |
| 5,532,613 | 7/1996 | Nagasawa et al. ............. 324/741 |
| 5,545,589 | 8/1996 | Tomura et al. ................ 438/119 |
| 5,545,920 | 8/1996 | Russell ......................... 257/666 |
| 5,550,083 | 8/1996 | Koide et al. ...................... 438/4 |
| 5,559,054 | 9/1996 | Adamjee ....................... 438/617 |
| 5,559,366 | 9/1996 | Fogal et al. ................... 257/666 |
| 5,585,282 | 12/1996 | Wood et al. ................... 438/613 |
| 5,592,736 | 1/1997 | Akram et al. .................. 257/706 |
| 5,656,858 | 8/1997 | Kondo et al. .................. 257/778 |
| 5,726,501 | 3/1998 | Matsubara ..................... 257/779 |
| 5,726,502 | 3/1998 | Beddingfield .................. 257/778 |
| 5,736,790 | 4/1998 | Iyogi et al. .................... 257/780 |
| 5,783,865 | 7/1998 | Higashiguchi et al. ......... 257/778 |
| 5,783,870 | 7/1998 | Mostafazadeh et al. ....... 257/778 |
| 5,801,449 | 9/1998 | Dehaine et al. ................ 257/779 |

FOREIGN PATENT DOCUMENTS

| 0 540 312 A1 | 5/1993 | (EP) ............................. 257/780 |
| 62-266857 | 11/1987 | (JP) ............................. 257/738 |
| 2-191334 | 7/1990 | (JP) ............................. 257/780 |

Primary Examiner—Alexander O. Williams
(74) Attorney, Agent, or Firm—TraskBritt

(57) ABSTRACT

A bumped semiconductor device contact structure is disclosed including at least one non-planar contact pad having a plurality of projections extending therefrom for contacting at least one solder ball of a bumped integrated circuit (IC) device, such as a bumped die and a bumped packaged IC device. The projections are arranged to make electrical contact with the solder balls of a bumped IC device without substantially deforming the solder ball. Accordingly, reflow of solder balls to reform the solder balls is not necessary with the contact pad of the present invention. Such a contact pad may be provided on various testing equipment such as probes and the like and may be used for both temporary and permanent connections. Also disclosed is an improved method of forming the contact pads by etching and deposition.

34 Claims, 6 Drawing Sheets

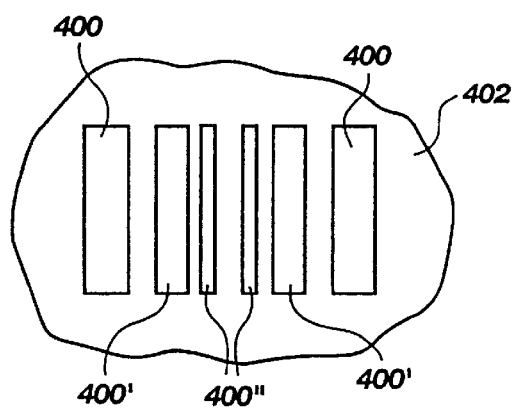
Fig. 9A
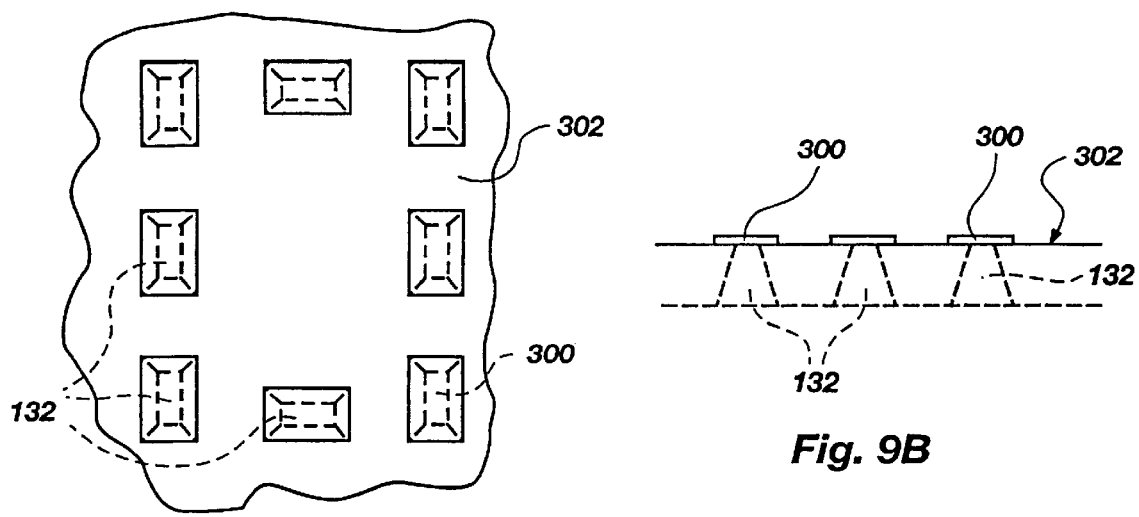
Fig. 9B
Fig. 10B
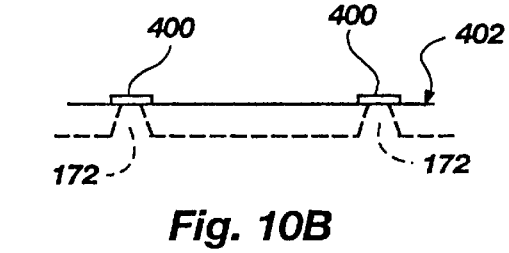
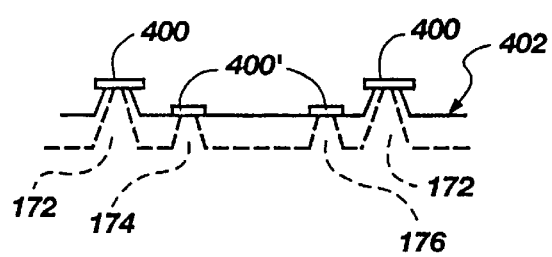
Fig. 10C
Fig. 10A
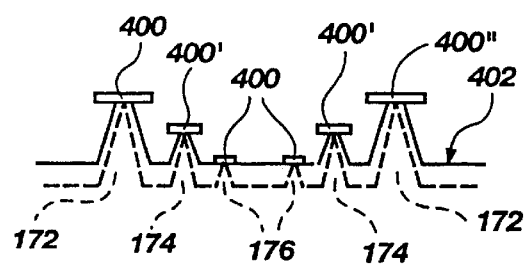
Fig. 10D

CARRIERS INCLUDING PROJECTED CONTACT STRUCTURES FOR ENGAGING BUMPED SEMICONDUCTOR DEVICES

CROSS REFERENCE TO RELATED APPLICATION

This application is a continuation of application Ser. No. 08/828,255, filed Mar. 26, 1997, now U.S. Pat. No. 5,929,521, issued Jul. 27, 1999.

BACKGROUND OF THE INVENTION

1. Field of the Invention

The present invention relates generally to apparatus and methods for making temporary contact with bumped semiconductor devices. More specifically, the invention relates to contact structures having non-planar or raised surfaces formed to reduce deformation of solder balls on bumped dice when engaged by such contact structures.

2. State of the Art

Semiconductor devices are subjected to a series of test procedures in order to ensure quality and reliability. The testing procedures conventionally include "probe testing" in which individual integrated circuits (ICs), while still on the wafer, are initially tested to determine functionality and speed. Probe cards and other test heads are used to electrically test ICs at the wafer level by making electrical connection interfaces with a single IC at a time. If the wafer has a yield of ICs which indicates that the quality and quantity of functional ICs is likely to be good, the individual ICs are singulated or "diced" from the wafer with a wafer saw. Each individual die may be assembled in a package to form an IC device or may be bumped with solder (usually prior to separation from the wafer) for direct flip-chip bonding to a semiconductor substrate.

In many semiconductor applications, formation of conductive bumps on the bond pads of an IC die is necessary or desirable. The most common applications where conductive bumps are used include tape automated bonding (TAB), flip-chip attachment of a die to a carrier substrate, such as a printed circuit board (PCB) (i.e., chip-on-board (COB) chip scale packages). Formation of the conductive bumps used in these applications can be accomplished using a variety of commonly known methods, such as metal deposition onto bond pads by screening or printing, or ball bumping techniques using wire bonding equipment.

A widely practiced way to increase the number of available input/output (I/O) connections is to use flip-chip methodology for packaging where an array of connection elements is positioned on the active surface of the die and the die is mounted active surface down upon a single-chip or multi-chip substrate (i.e., a chip or module carrier) and bonded to the terminal pads of the substrate through the connection elements.

One method of flip-chip attachment is controlled collapsed chip connection (C4), pioneered by International Business Machines Corp. during the 1960s. In C4 bonding, an array of solder bumps, corresponding to an array of contacts, connects the flipped die to the single-chip or multi-chip carrier substrate such as a PCB. The single-chip or multi-chip structure may subsequently be packaged and mounted to higher-level packaging such as a mother board or chassis. Many variations of the original C4 technology are practiced in the art to produce metallic, reflowable balls.

Because of the high manufacturing costs associated with state-of-the-art metal deposition techniques, many semiconductor manufacturers have resorted to ball bumping processes using standard wire bonding tools to form conductive bumps over the bond pads. In the ball bumping process, a capillary of the wire bonding tool carries a conductive wire toward a bond pad on which a bump is to be formed. A ball is formed at an end of the wire by heating and melting the metal wire. The wire bonding tool capillary then presses the ball against the planar bond pad and the portion of the wire extending past the ball is cut, leaving a ball bump on the bond pad.

Various materials are typically used to form the bumps on the die, such as solder, gold, conductive polymers, etc. Typically, if the bumps are solder bumps, the solder bumps are deposited, reflowed to form a spherical shape, and subsequently re-heated to form a solder joint between the bond pads on the so-called flip-chip and the carrier substrate terminal pads, the solder joint forming both electrical and mechanical connections between the flip-chip and carrier substrate. U.S. Pat. No. 5,426,266 to Brown et al. discloses a connection for flip-chip mounting a "bumped" IC die directly to a semiconductor substrate in which a circuit run having an end that is formed into a patterned bond pad lies directly underneath the bond pad of the die. The patterned bond pad of the circuit run includes cutout areas that form a metallization pattern of conductive ridges and expose portions of the underlying substrate. A gold, indium or copper bump of the die is compressed into the cutout portions between the ridges of the patterned bond pad, thus mechanically interlocking the metal bump with the patterned bond pad at the end of the circuit run. Accordingly, significant deformation of the metal ball results.

Dice destined for flip-chip attachment are often tested after having been "bumped" (i.e., forming solder or other metal balls on the bond pads of the die) by contacting and usually penetrating, to some degree, the solder balls with needle-like probes. Such tests may include full functional testing where the operation of the unpackaged die is evaluated, burn-in testing where various performance parameters may be tested while changing environmental conditions such as temperature, voltage and current, and various other tests. A typical probe is a pointed needle-like element of small size (significantly smaller in diameter than the solder ball diameter) that penetrates the solder ball, piercing any oxidation layer present on the outside of the solder ball and making good electrical contact with the underlying metal. An exemplary probing device is disclosed in U.S. Pat. No. 5,532,613 to Nagasawa et al., which includes a probe needle having a pointed or conical tip. Another probe structure having a linearly-extending serrated tip is disclosed in U.S. Pat. No. 5,428,298 to Ko. Penetration of the solder ball by the probe typically gouges, pits and deforms the solder ball, creating closed cavities on the bottom center surface thereof such that the probed solder balls must be reflowed to return the solder ball to its pre-probed shape (i.e., substantially spherical) prior to connection of the die to the carrier substrate. Without such a preliminary reflow, organics and other contaminants may be trapped between the face of the solicited bump and substrate terminal pad after connection, or trapped, heated gas may form a bubble at the connection site, reducing the mechanical strength of the bond and impairing the ohmic contact between the bond pad of the die and the terminal pad of the substrate. Although the bumps can be reshaped after testing by reflowing the solder, such reshaping is an unnecessary and hazardous expense that subjects the dice to an additional heating step that can adversely affect the operation and performance of the IC.

While probe needles provide one type of probe tip, other probe tips are also known in the art. One such probe tip, disclosed in U.S. Pat. No. 5,585,282 to Wood et al. and assigned to the assignee of the present invention, includes a contact member having raised portions thereon used to penetrate and make electrical contact directly with bond pads or bumped bond pads of a die. In U.S. Pat. No. 5,592,736 to Akram et al., also assigned to the assignee of the present invention, contacts having sharpened elongated projections are employed to make penetrating contact with the solder balls of bumped bond pads. While such probe or contact structures make good electrical contact with the solder balls, the bottom center of the solder balls may be significantly deformed by the contact, forming closed cavities in the bottoms of the balls which may trap organics and other contaminants if a preliminary reflow is not performed to reform the balls prior to die-to-carrier substrate interconnection. Furthermore, the aforementioned structures do not easily accommodate measurable differences in the heights of different bumps or balls on the active surface of a die.

Another approach to interconnection of bumped semiconductive devices for testing purposes or permanent inclusion in an electrical circuit is disclosed in U.S. Pat. No. 5,207,585 to Byrnes et al., wherein a flexible membrane bearing electrodes thereon is placed in contact with the bumps of the die, and the electrodes mechanically pressed into the bumps. Different electrode face configurations are disclosed, including one (see FIG. 9 of the '585 patent) shaped to "prevent the formation of deep isolated indents in the C4 bump to prevent the formation of voids during solder reflow to reshape the C4 bump after electrical testing." Thus, the previously mentioned, isolated or closed-cavity problem is acknowledged, but no solution presented which would either avoid damage to the bump centers or eliminate the need for a preliminary reflow to reshape the C4 (solder) bump after testing. In addition, there is no accommodation for different bump heights on the same die.

In view of the aforementioned drawbacks, it would be advantageous to provide an economical solder ball contact and method of manufacturing such a contact that reduces or eliminates damaging deformation of the solder ball and does not form closed cavities in the surface thereof, while enhancing contact-to-solder ball connection in a manner which accommodates height variations between balls. It would also be advantageous to provide a carrier substrate with the improved contact for temporary or permanent semiconductor substrate-to-die interconnections.

SUMMARY OF THE INVENTION

According to the present invention, a contact pad of the type used to make physical and electrical contact with a solder ball or bump of an integrated circuit die includes non-planar or raised surfaces or projections formed to reduce or eliminate damaging deformation of the outer face of the solder ball upon contact with the solder ball by the contact pad. Such contact pads may be provided on the end of a probing device and other testing equipment known in the art of semiconductor devices, and may also be employed in permanent die-to-carrier substrate connections. Advantageously, the contact pad provides projections configured to penetrate an oxide layer of a solder ball without excessively deforming the solder ball and particularly the central, bottom portion of the ball adjacent the contact pad. The projections are also configured and arranged to allow gases (e.g., air), organics such as flux and other contaminants that may otherwise become trapped between the contact pad and the solder ball to escape when the solder ball is reflowed during connection to a carrier substrate. Compression of the balls of a semiconductor device against a matching group of contact pads also serves to enhance the mutual planarity and consistency of the projection of the balls from the semiconductor device after test or burn-in is completed and the device removed from the contact pads.

In a preferred embodiment, the contact structure comprises pyramid-like projections, radially extending and substantially constantly increasing in height from proximate a central portion of the contact pad to proximate the outer perimeter or edge of the contact pad. The projections, in effect, center and cradle the solder ball, leaving the center of the ball adjacent the contact in an imperforate state.

In another preferred embodiment, the contact structure comprises a plurality of projections having adjoining sloped surfaces that form a frame-like pocket for receiving a solder ball of a bumped IC device, piercing the solder ball toward its radial or lateral periphery and leaving the outermost, projecting center of the ball in a pristine state.

In another preferred embodiment, the contact structure comprises a plurality of projections having sloped surfaces, the structure being similar to the previous embodiment, but with each projection spaced from an adjacent projection to provide a pathway or vent between projections to permit flow of gases, flux, contaminants, and other substances between the solder ball and the contact structure. The sloped surfaces may be substantially planar, curved or of any other shape.

In yet another preferred embodiment, the contact structure comprises a plurality of different height projections having, for example, rectangular, circular, triangular, or trapezoidal cross-sectional shapes. Preferably, larger projections surround smaller projections so that smaller projections are closer to the center of the contact pad.

Because the contact pads lie generally in the same plane and the centers of the contact pads are planar while the projections (of various configurations as disclosed) increase in height as their distance from the pad center increases, balls or bumps of varying heights projecting from the same die may be accommodated. Specifically, the projections of the contact structures can penetrate different distances into the solder balls, depending on the size of the solder ball (i.e., penetrating a greater distance into larger solder balls), while the ball centers lie flat against the centers of the contact pads.

According to further principles of the present invention, subtractive as well as additive methods for forming such contact structures are also disclosed. Subtractive formation comprises the steps of masking the material of the carrier substrate on which the contact pad is to be formed and etching the substrate material to form the projections thereon. The projections may also be formed by the additive methods of stenciling or printing, stamping, electrochemical or electroless plating, or adhesive application or other bonding of preformed contact pads having projections thereon.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

FIGS. 9A and 9B illustrate a method of forming the contact structure illustrated in FIGS. 5A and 5B;

FIGS. 10A, 10B, 10C and 10D illustrate a method of forming the contact structure illustrated in FIGS. 7A and 7B;

DETAILED DESCRIPTION OF THE INVENTION

Figure 1A:
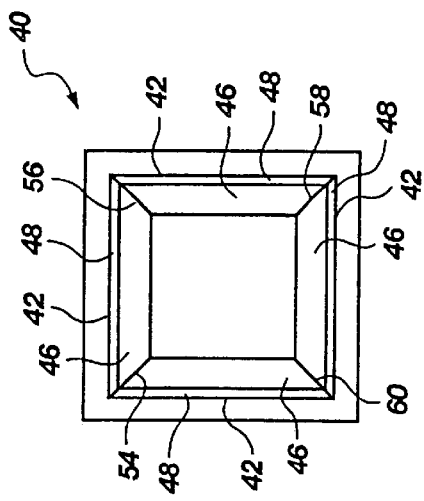
FIG. 1A illustrates a top view of a first embodiment of a contact structure in accordance with the present invention.
Figure 1B:
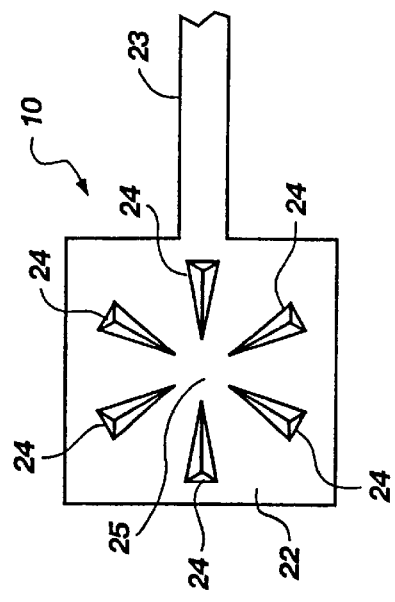
FIG. 1B illustrates a cross-sectional side view of the contact structure shown in FIG. 1A engaging a solder ball of a bumped integrated circuit (IC) die.

Illustrated in FIGS. 1A and 1B is a first embodiment of a contact structure 10 for making engaging contact with a bump or solder ball 12 (typically having a diameter of 1 $\mu$m–500 $\mu$m) attached to a bond pad 16 of an integrated circuit (IC) die 14. The solder ball 12 is formed on a conventional bond pad 16 in accordance with conventional methods, such as the aforementioned C4 technique, or by using a wire bonding machine. Specifically in FIG. 1B, the bond pad 16, which is used to electrically connect a surface-mounted IC package to a conductor for input/output (I/O) capabilities, is illustrated. The bond pad 16 includes a bottom surface 18 which is in electrical connection with circuitry (not shown) of the IC die 14. The bond pad 16 also includes a planar surface 20 which is traditionally composed of an aluminum alloy layer. It is noted that the IC die 14 may be comprised of any one of various known types of semiconductor devices, including memories (such as DRAMS, SRAMS, flash memories, etc.), microprocessors, application specific integrated circuits (ASICs), digital signal processors (DSPs) and the like.

The contact structure 10 comprises a contact pad 22 having a conductive trace 23 extending therefrom and a plurality of projections 24 that protrude upwardly from the substantially planar surface 26 of the contact pad 22 a varying height which may range from as little as one-thousandth to as much as one-quarter the diameter of the solder ball 12. Projections 24 are radially oriented about central contact area 25 of contact pad 22, which is planar and devoid of projections. The variable projection height is selected to allow good electrical contact and at the same time provide minimum damage to the solder ball 12, and particularly the center thereof. While the surface of the contact pad 22 is illustrated as having a generally rectangular configuration, the contact pad 22 can be configured in a variety of shapes and interspersed patterns designed to promote an efficient, compact pad layout. The contact pad 22 is generally composed of aluminum or an aluminum alloy, but may include various layers, such as, for example, an upper surface defined by an aluminum alloy layer and a lower surface consisting of a copper alloy layer. The contact structure 10 is formed on or attached to a carrier substrate 29 such as an FR-4 board, a ceramic substrate, a silicon substrate, a silicon-on-sapphire substrate, a germanium substrate, or any other suitable chip carrier structure known in the art. In the case of conductive or semiconductor substrates such as Si, an insulator must be formed or applied between contact pads 22 and the underlying carrier substrate 29.

As shown in FIG. 1B, the contact pad 22 includes elevated regions or projections 24 on the surface 26 of the contact pad 22. The projections 24 are preferably configured in a concentric, radially extending and symmetrical pattern (as shown in FIG. 1A) to uniformly align and cradle the solder ball 12 thereinbetween. The projections 24 can be formed on the contact pad 22 using various "additive" methods known in the art, such as by molding or layer depositing the projections 24 (here seen as radially extending, triangular or pyramid-like structures) of a conductive material through a mask and onto the surface 26 of the contact pad 22. Other additive processes which may be employed include depositing the desired materials and patterning using lithography, as known in the art, to form desired shapes. Alternatively, "subtractive" techniques, such as etching, laser ablation or electrical discharge machining a pattern onto the carrier substrate 29 may be used to produce the projections in the desired shape, height and pattern, following which the conductive traces may be formed by techniques known in the art, the conductive material also defining the contact pads at the ends of the traces and covering the projections. Those skilled in the art will recognize that numerous other techniques are available for forming a suitable pattern of projections 24 on the surface 26 of contact pad 22. Where the projections are formed via subtractive techniques (such as etching or machining), as opposed to additive techniques, the projections 24 may optionally be defined entirely by the conductive material of the contact pad 22 itself applied to the substrate material upon which the subtractive process is used.

Where additive techniques are employed, the projections 24 can be formed with any suitable conductive material, such as a conductive epoxy, aluminum, iridium, copper, gold, platinum, titanium, tungsten, tantalum, molybdenum, or alloys of these metals. Preferably, the selected materials will not adhere or transfer material to the solder ball. For example, tungsten may be used to form the projections 24 for some applications, but may not be desirable for mating with a gold bump as residual tungsten will remain on the bump after removal from the contact. It is noted that the projections may be formed of one or more layers of materials such that the majority of the projection is formed from a less expensive material with an outer layer provided for good electrical contact and material compatibility to the metal ball. If, however, the contact structure of the invention is employed to make a permanent connection to the bumps of the IC die, then the conductive material selected for contact with the bump should be one that chemically and/or metallurgically bonds well to metals or alloys used in conventional flip-chip bonding techniques, including copper, gold, aluminum, silver and alloys thereof.

It is also contemplated that projection patterns may be formed on the exposed surfaces of contact pad 22 by stamping or other mechanical working techniques involving neither subtraction nor addition of material to the contact pad surface. Further, the contact pads 22 themselves may, in some instances, be integrally formed with a three-dimensional topography on their exposed surfaces, such as by deposition of contact pad material from mold cavities having a reverse of the intended contact pad surface topography on their interiors.

The non-planar contact surface of the instant invention provides a contact structure 10 that can engage a solder ball 12 without substantially detrimentally deforming the solder ball 12. The projections 24 pierce or engage the outer surface 30 of the solder ball 12 to ensure good electrical contact therewith, as in some of the aforementioned state-of-the-art contact or probe structures. However, because the projections 24 engage the solder ball 12, along thin, knife-like contact edges, the shape envelope of solder ball 12 is substantially maintained as the relatively higher force per unit area (in comparison to state-of-the-art contacts) results in deeper but cleaner penetration, "slicing" rather than "pushing" into the soder ball 12, thus minimizing deformation of the "envelope" of the solder ball. Moreover, due to the arrangement of projections 24 and their variable height, which increases toward the periphery of the contact pad 22, the bottom 28 of the solder ball 12 is not substantially deformed, pitted or gouged as is the case with conventional contact pads. Moreover, gases, organics such as flux, and other contaminants can flow or be vented from the center of solder ball 12 when it is heated (reflowed) to permanently attach the die to a carrier substrate, the deep but narrow ravine-like slices cut by projections 24 providing ready paths for such venting. Moreover, if contact structure 10 is employed for a permanent connection and reflow is effected, venting may readily take place through radial passages defined between projections 24 and between the outer surface 30 of the solder ball 12 and the planar surface 26 of contact pad 22, so that contaminants will not become trapped between the contact structure 10 and the solder ball 12. With conventional contact pads, the solder ball 12 would require a preliminary reflow prior to permanent connection to reshape the solder ball and to remove gouges and pits therefrom. After engagement with the contact structure 10 of the present invention, however, such reflow of the solder ball 12 is not necessary because the solder ball 12 substantially retains its pre-engagement shape, a pristine central portion, and is not damaged with isolated or closed cavities such as gouges or pits.

Figure 2A:
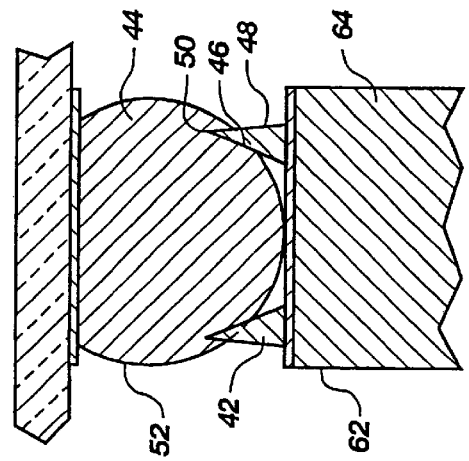
FIG. 2A illustrates a top view of a second embodiment of a contact structure in accordance with the present invention.
Figure 2B:
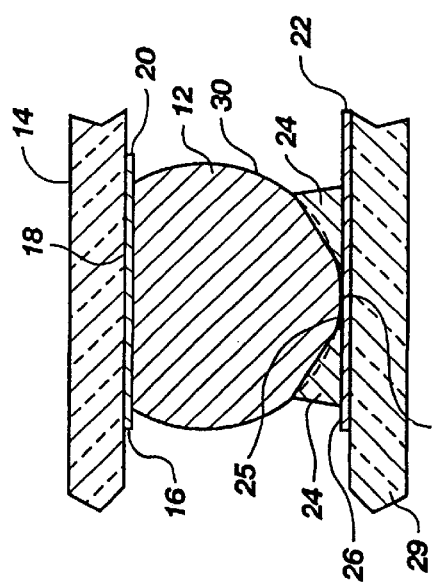
FIG. 2B illustrates a cross-sectional side view of the contact structure shown in FIG. 2A engaging a solder ball of a bumped IC die.

FIGS. 2A and 2B illustrate a second embodiment of a contact structure 40 made in accordance to the principles of the present invention. While the contact structure 40 also includes a plurality of knife-like projections 42, the projections 42 are adjoined to form a frame-like receptacle for receiving a solder ball 44 therebetween. Each projection 42 is comprised of a pair of planar, sloping surfaces 46 and 48 that form a linear, ridge-like peak 50. Because ridge-like peaks define a square and the solder ball 44 is substantially spherical, gaps or vents are formed between the outer surface 52 of the solder ball 44 and the surfaces 46 at the corners 54, 56, 58 and 60. Further, the blade-like projections 42 are spaced far enough from the center of contact structure 40 that each "slice" made by a projection 42 lies away from the center of the ball and is open at both ends. Whether the contact structures 40 of the present invention are permanently engaged with the solder balls 44 by a heat-induced reflow or are removed for subsequent reflow connections, gases and other contaminants are permitted to flow or vent between the solder ball and contact structure. In this embodiment, the contact structure 40 is depicted as attached to the tip 62 of a probe needle 64. It might, however, be attached to a carrier substrate made, for example, of silicon. Both additive and subtractive methods can be used to achieve this configuration.

Figure 3A:
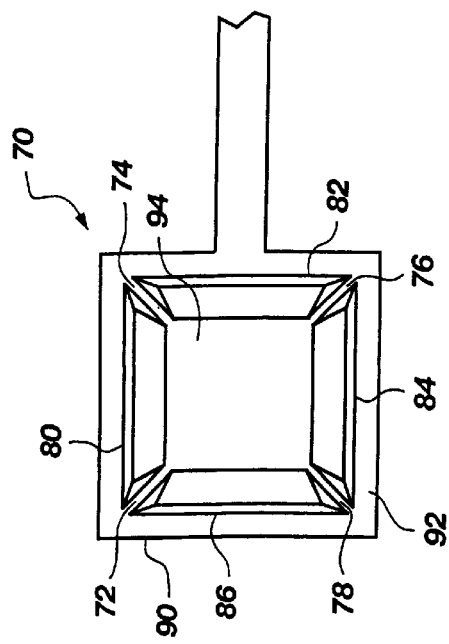
FIG. 3A illustrates a top view of a third embodiment of a contact structure in accordance with the present invention.
Figure 3B:
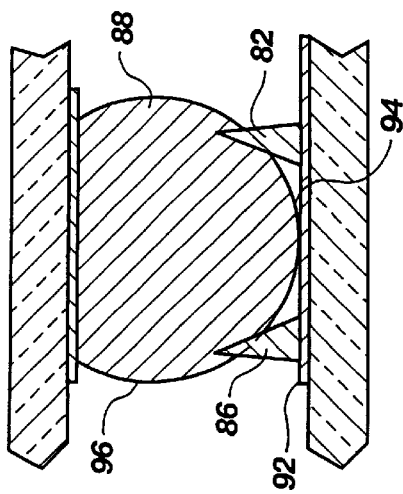
FIG. 3B illustrates a cross-sectional side view of the contact structure shown in FIG. 3A engaging a solder ball of a bumped IC die.
Figure 11:
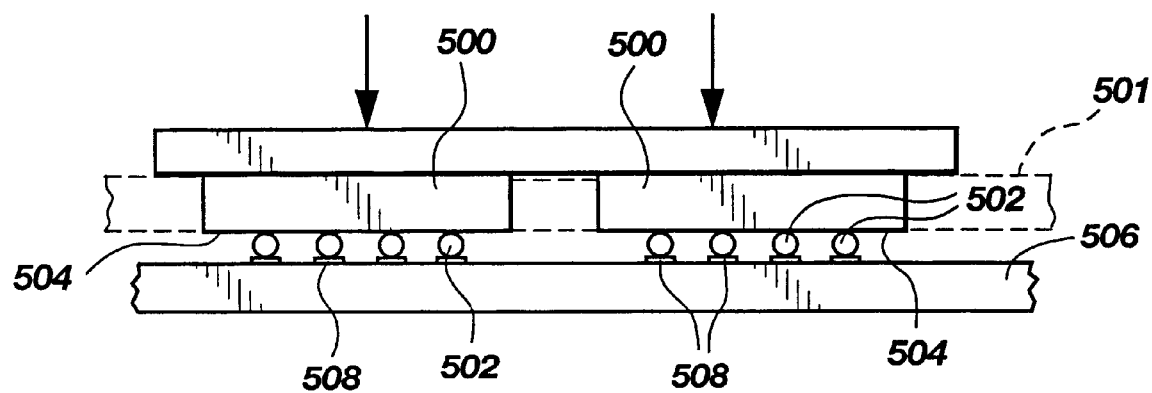
FIG. 11 is a side elevation of a carrier substrate bearing contact pads according to the present invention to which flip-chip dice are mounted.
Figure 12:
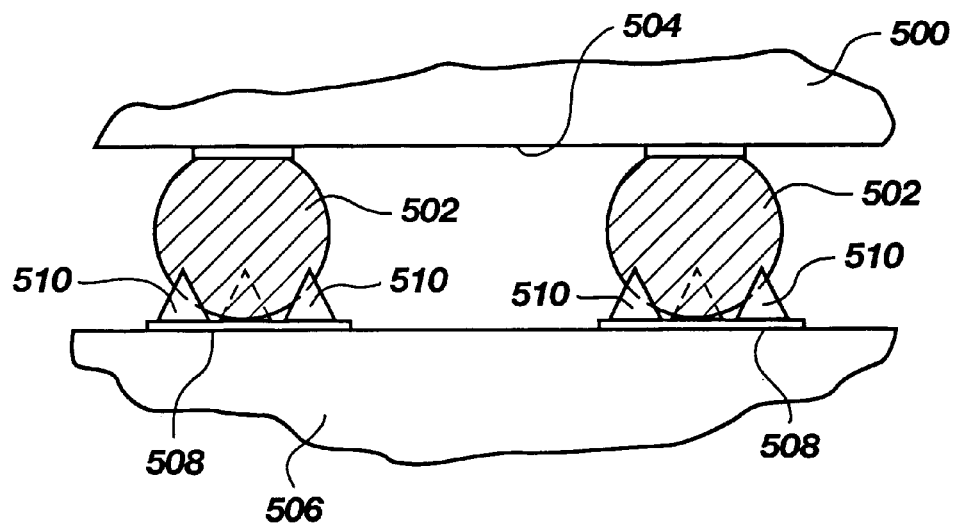
FIG. 12 is an enlarged, partial sectional view of a portion of FIG. 11, depicting the manner in which variously-sized conductive bumps or balls are accommodated by the contact pads of the present invention.

FIGS. 3A and 3B illustrate another embodiment of a contact structure 70 in accordance with the present invention. Contact structure 70 is particularly suitable for a permanent connection but can be used for temporary contacts as well. It is currently believed by the inventors that contact structure 70 may comprise a preferred embodiment of the invention. The contact structure 70 is similar to the contact structure 40 illustrated in FIGS. 2A and 2B, but includes corner gaps 72, 74, 76, and 78 defined by spacing trapezoidally shaped, blade-like projections 80, 82, 84, and 86 a distance apart from one another. The gaps 72, 74, 76, and 78 provide passageways through which gases and contaminants can flow to prevent trapping of same between the outer surface 96 of the solder ball 88 and contact structure 70. Additionally, the projections 80, 82, 84, and 86 are positioned sufficiently outboard toward the periphery 90 of contact pad 92 so that the central, bottom portion of solder ball 88 makes little or no deforming contact with the central surface 94 of the contact pad 92 itself until projections 80–86 have pierced outer surface 96. As solder balls 88 on the same die may vary in height by as much as fifteen percent (15%), the contact structures of the invention, including contact structure 70, accommodate such variances. For example, a relatively larger solder ball 88 might "bottom out" on the central surface 94, becoming slightly deformed or flattened after penetration of the oxide coating and outer ball surface 96, while a relatively smaller solder ball 88 might remain suspended above central surface 94, good ohmic contact being made in both instances with the oxide-free interior of solder balls 88 over the substantial surface area of projections 80–86 extending into the balls. Good contact between contacts of the invention and all of the variously sized solder balls of the IC die may be made or enhanced by so-called "spanking" of the die against the co-planar contact pads, i.e., vertically oriented movement coupled, if desired, with ultrasonic vibrations. This same process results in highly accurate planarization of the outermost surfaces of all of the solder balls of a given die or wafer (if conducted on a wafer scale). FIG. 11 of the drawings depicts a plurality of flip-chip dice 500, or a plurality of unsingulated semiconductor dice in other embodiments, (the unsingulated dice represented by dashed lines 501) bearing conductive bumps 502 on active surfaces 504 being "spanked" against a carrier substrate 506, or a wafer-scale substrate in other embodiments, bearing contact pads 508 according to the present invention. FIG. 12 shows an enlarged portion of a flip-chip die 500 with sectioned conductive bumps 502 after the "spanking", wherein the conductive bumps 502 have been cradled and aligned by the projections 510 of contact pads 508, projections 510 then penetrating the exterior surfaces of conductive bumps 502 without deforming the shape envelope thereof. It should be further noted that the conductive bumps 502 depicted in FIG. 12 are of different heights, illustrating the manner in which the present invention accommodates such differences while still providing good electrical contact with all of the conductive bumps 502 and without deformation of the bump shape envelopes or formation of gouges, pits or other cavities in the centers of the conductive bumps 502 proximate the surfaces of contact pads 508. If the left-hand (larger) conductive bump 502, shown in FIG. 12, is of great enough height to abut a contact pad when "spanked," the bottom center portion of conductive bump 502 may be slightly flattened. Thus, as noted above, all conductive bumps 502 of a given die or wafer will be planarized to a common reference plane, and the force of the spanking may be adjusted to ensure such abutment and planarization for a given size or height range of conductive bumps 502.

Figure 4A:
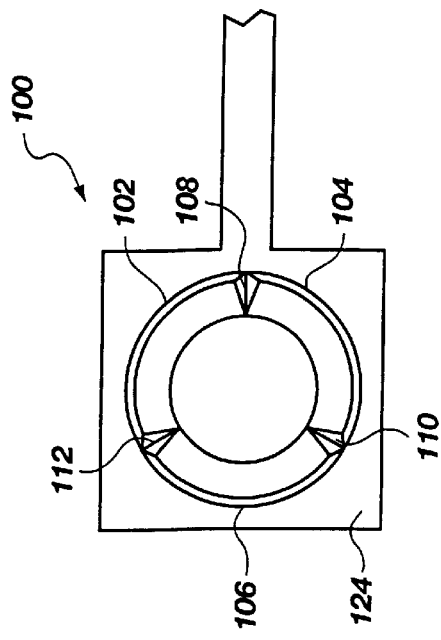
FIG. 4A illustrates a top view of a fourth embodiment of a contact structure in accordance with the present invention.
Figure 4B:
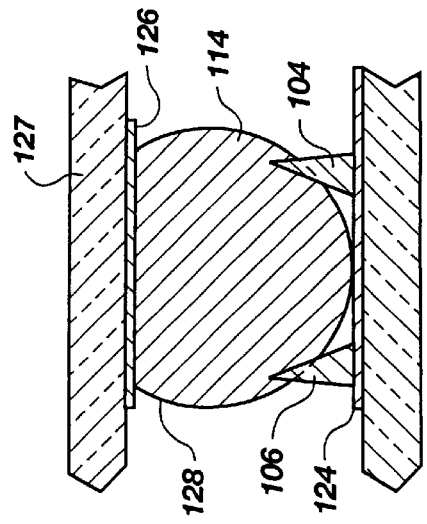
FIG. 4B illustrates a cross-sectional side view of the contact structure shown in FIG. 4A engaging a solder ball of a bumped IC die.

FIGS. 4A and 4B illustrate yet another embodiment of a contact structure 100 according to the present invention. The contact structure 100 is comprised of a plurality of curved, blade-like projections 102, 104, and 106. The projections 102, 104, and 106 are separated by gaps 108, 110, and 112 that allow gases and other contaminants to flow from under the solder ball 114. It is noted that the depth of penetration of the projections 102, 104, and 106 into the solder ball 114 can be controlled by controlling relative vertical movement of the contact pad 124 and the bond pad 126. It is desirable in this embodiment, as well as others herein described, that the projections penetrate the solder ball 114 a sufficient distance to pierce an oxidation layer that typically forms on the outer surface 128 of the solder ball 114. Penetration of the oxidation layer ensures good electrical contact with the solder ball by the contact structure 100. As noted above, because the projections 102, 104, and 106 penetrate the solder ball, a device employing several contact structures 100, all lying in substantially the same plane, can make contact with a plurality of solder balls 114 attached to the bond pads 126 of a die 127, even if the relative height of each of the solder balls 114 varies.

Figure 5A:
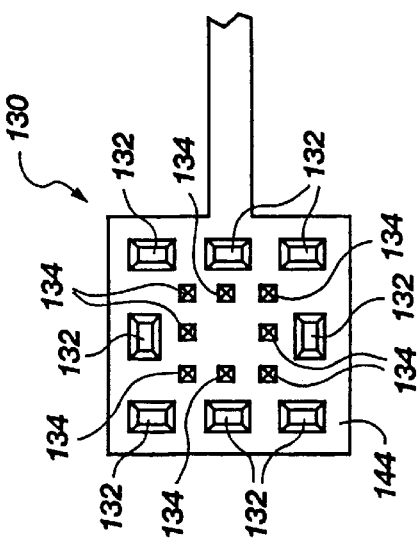
FIG. 5A illustrates a top view of a fifth embodiment of a contact structure in accordance with the present invention.
Figure 5B:
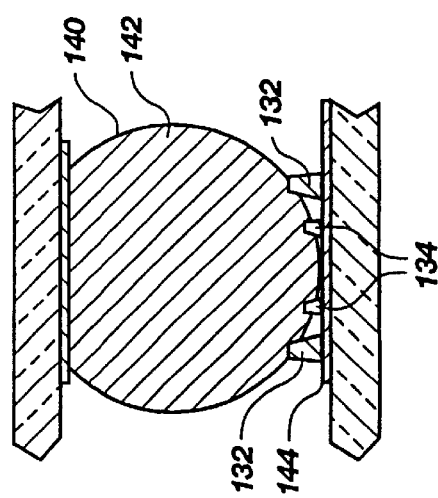
FIG. 5B illustrates a cross-sectional side view of the contact structure shown in FIG. 5A engaging a solder ball of a bumped IC die.
Figure 8A:
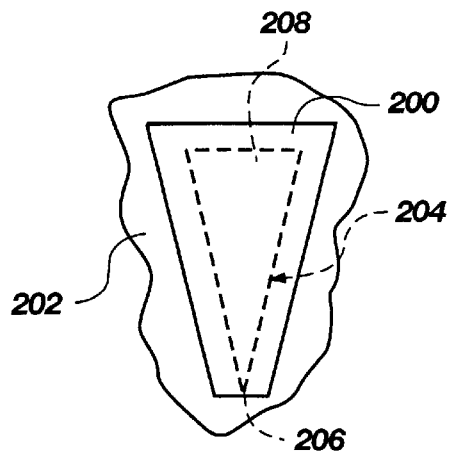
FIGS. 8A, 8B, 8C, 8D and 8E illustrate a method of forming the contact structure illustrated in FIGS. 1A and 1B.
Figure 8B:
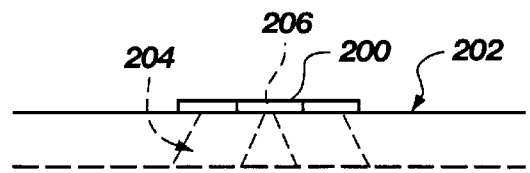
Figure 8C:
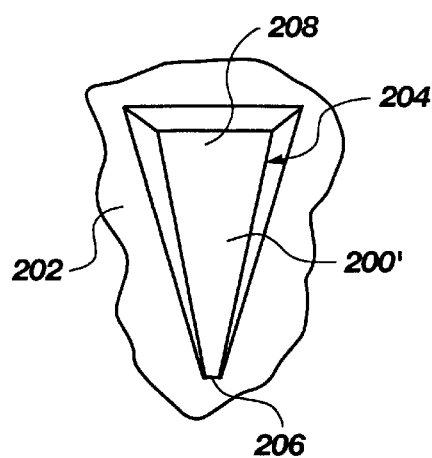
Figure 8D:
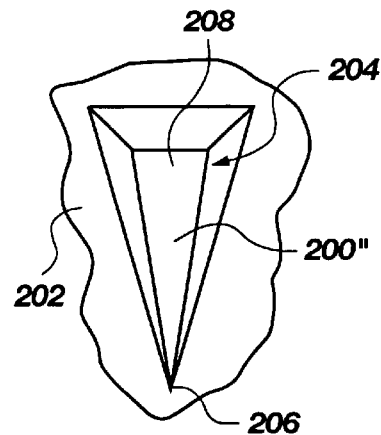
Figure 8E:
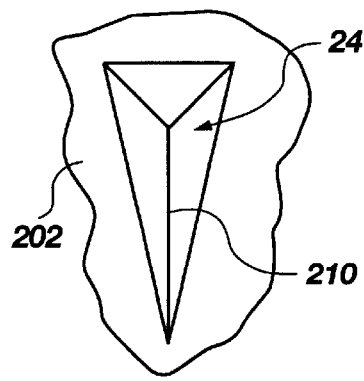

Referring now to FIGS. 5A and 5B, the embodiment comprising contact structure 130 includes a plurality of relatively small, pyramidal projections 132 and 134 of rectangular transverse cross-section. The projections 132 and 134 are located in inner and outer groups, the larger projections 132 being in the outer group and the smaller projections 134 being in the inner group closer to the center of contact pad 144. Projections 132 and 134 are positioned and have sufficient height for their locations to pierce the outer surface 140 of the solder ball 142, such that the rest of the solder ball 142 makes little or no substantial, deforming contact with the contact pad 144. In addition, the projections 132, 134 are radially spaced from the center of the contact pad 144 to allow seating of the solder ball 142 thereinbetween.

Figure 6A:
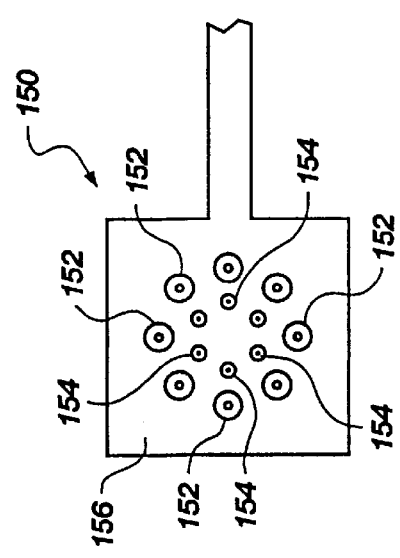
FIG. 6A illustrates a top view of a sixth embodiment of a contact structure in accordance with the present invention.
Figure 6B:
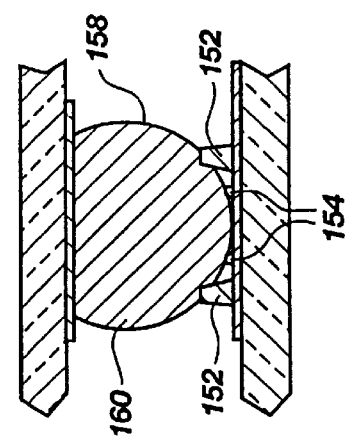
FIG. 6B illustrates a cross-sectional side view of the contact structure shown in FIG. 6A engaging a solder ball of a bumped IC die.

FIGS. 6A and 6B illustrate yet another embodiment of a contact structure 150 in accordance with the present invention. The contact structure 150 comprises a first plurality of conically-shaped projections 152 surrounding a second plurality of conically-shaped projections 154, the first and second plurality of conically-shaped projections 152 and 154 being radially spaced from the center of the contact pad 156. The conically-shaped projections 152 have a height greater than the height of the conically-shaped projections 154 and are sized and positioned to make penetrating contact with the outer surface 158 of a substantially spherical solder ball 160 without substantially deforming the solder ball 160 (i.e., deforming the solder ball 160 substantially out of round). The contact structure 150 functions in much the same way as the contact structure 130 of FIGS. 5A and 5B but includes additional projections 152 and 154, which provide an increased number of penetrations of the outer surface 158 of solder ball 160 for greater ohmic contact with the solder ball 160.

Figure 7A:
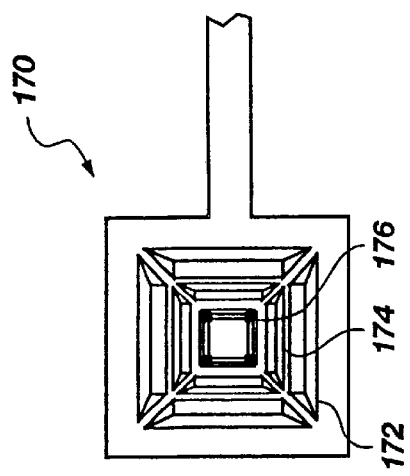
FIG. 7A illustrates a top view of a seventh embodiment of a contact structure in accordance with the present invention.
Figure 7B:
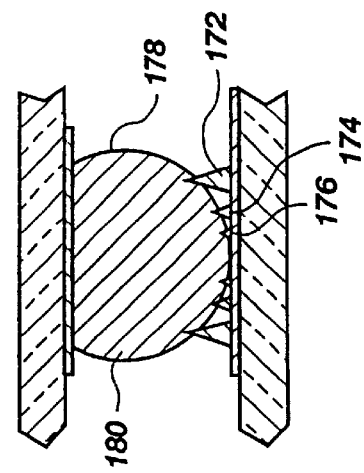
FIG. 7B illustrates a cross-sectional side view of the contact structure shown in FIG. 7A engaging a solder ball of a bumped IC die.

Finally, in FIGS. 7A and 7B, contact structure 170 provides three levels or heights of knife-like or sharpened projections 172, 174 and 176 of trapezoidal, transverse cross-section configured to engage the perimeter or outer surface 178 of a solder ball 180. The projections 172, 174, and 176 are each sized and positioned to penetrate the outer surface 178 of the solder ball 180 approximately the same distance and thus prevent the solder ball 180 from being substantially deformed and squeezed by the engaging contact of the projections 172, 174, and 176.

As previously noted, any of the contact pads herein described may be formed by additive, subtractive, or material-neutral methods. A preferred method embodiment comprises essentially subtractive formation of the contact pads. A carrier substrate blank of a preferred material which preferably matches the coefficient of thermal expansion of a silicon die is provided. Suitable substrate materials include monocrystalline silicon, silicon-on-glass, silicon-on-sapphire, germanium, and ceramics. One or more masks formed of an etch resistant material (i.e., a resist) are applied to an exposed major surface of the substrate blank. The mask may comprise a layer of material such as silicon nitride ($Si_3N_4$), typically having a thickness of about 500 Å to 6000 Å, deposited by a suitable deposition process, such as chemical vapor deposition (CVD). The mask is patterned and etched selectively to the substrate to form a hard mask including masking blocks patterned to define contact pad projection locations and protective of the underlying substrate blank material. A mask layer of ($Si_3N_4$) may be etched to form masking blocks with hot (e.g., 180° C.) phosphoric acid. If another material is employed for a mask, other wet or dry etches may be suitable. Next, the knife-like or blade-like projections of the contact pad are formed using an etching process, wherein a wet or dry isotropic or anisotropic, but preferably anisotropic, etch process is employed to form the projections by undercutting the mask blocks with an etchant reacting with the substrate blank material. A mixture of KOH and $H_2O$ may be employed for an anisotropic etch, wherein the etch rate is different in different directions. In monocrystalline silicon, triangular cross-section, sharp projections will be formed due to the different etch rates along different crystalline orientations. The surface of the substrate, representing the {100} plane of the silicon, which will etch faster than the sloped sidewalls of the projections representing the {110} plane. Because of the aforementioned differences in rate of etching, the side surfaces of the projections will typically be formed at an angle of approximately 54° relative to a plane defined by the top surface substrate blank. Time, temperature and concentration of etchant may be altered to modify the exact shape and size of the projection structure.

If an isotropic etch (wherein the etch rate is substantially uniform in all directions) is desired, a mixture of HF, $HNO_3$ and $H_2O$ can be utilized. With an isotropic etch, sharpened projections may still be formed, but the sidewalls of the projections are arcuate and concave. The radius of the arc may be controlled by etch parameters including time, temperature, and concentration of etchant, and by the width of the masking blocks transverse to the longitudinal axis of an elongate projection.

A flat-topped, slope-walled, elongate projection or a truncated, pyramidal projection may be formed with an anisotropic etch of the previously-referenced type by suitable expansion of the width of the masking block (square or triangular, if a pyramid form is desired).

A closely-spaced array of projections with no planar substrate surface between adjacent projections may be formed using an anisotropic etch with a controlled etch time and masking block width.

Alternatively, in place of an isotropic or anisotropic etch process, the projections herein described may be formed using an oxidizing process. In such a process, the substrate blank may be subjected to an oxidizing atmosphere to oxidize exposed portions (i.e., those portions not covered by the masking blocks). The oxidizing atmosphere may comprise steam and $O_2$ at an elevated temperature (e.g., 950° C.). The oxidizing atmosphere oxidizes the exposed portions of the substrate blank and forms an oxide layer of, for example, silicon dioxide, while sharpened projections of unoxidized substrate material (silicon) are defined under the masking blocks as the oxidization process undercuts the mask material. The oxidized material can then be removed to expose the projections by employing a suitable wet etchant, such as HF.

Subsequent to formation of the sharp, blade-like or knife-like projection tips by any of the foregoing methods, they may be further sharpened by additional etching.

Following projection formation, an insulating layer, as of $SiO_2$, may be formed by exposing the substrate to an oxidizing atmosphere for a short time or, alternatively, using a CVD process.

A conductive layer is then formed over the insulating layer and overlying the areas of the substrate defining contact pad locations with projections extending therefrom. The conductive layer may comprise a highly conductive, low resistivity metal such as aluminum (Al), iridium (Ir), copper (Cu), titanium (Ti), tungsten (W), tantalum (Ta), molybdenum (Mo), beryllium (Be) or alloys of these metals. The contact pad/projection areas and conductive traces extending from the contact pads may be formed by deposition of the metal conductor, as by sputter or CVD deposition, photopatterning with a positive or negative resist, and etching with a wet or dry etch process.

A multiple-layer contact pad and projection metallization may also be employed, wherein a bottom or substrate layer of a metal compatible and forming a good bond with the substrate material is deposited and then covered with another layer which will not form a chemical or metallurgical bond with the material of the die ball or bump (unless a permanent connection is desired, and which is nonreactive to a temperature of up to about 200° C.).

A non-metallic conductive layer may be formed of a material such as doped polysilicon. For example, an LPCVD process may be used to form a conductive layer of phosphorous-doped polysilicon.

As an alternative to subtractive projection formation, the contact structures of the present invention may be formed by a deposition process to selectively deposit projections onto a contact pad surface previously formed on the exposed substrate. For example, a CVD process can be used to deposit a metal onto the contact pad, the metal being the same or a different metal than that comprising the contact pad.

By way of further explanation of the subtractive methodology of the present invention, formation of the projections of several embodiments of the contact pads will be briefly described with respect to several series of drawing figures.

Referring to FIGS. 8A through 8E, the radial, triangular projections 24 of the contact pad 10 of FIGS. 1A and 1B may be formed through use of a series of triangular masks. Commencing with FIGS. 8A and 8B, respectively being top and end views of a projection 24 in formation, an elongated trapezoidal, substantially triangular mask 200 is formed or placed on a silicon substrate blank 202. An anisotropic etch as previously described is performed, resulting in a projection body 204 having a point 206 at the narrow end of the mask 200 from undercutting thereof by the etchant, while the wide end of the mask 200 covers a flat mesa top 208 on the projection body 204. Next, a shorter, narrower mask 200' is formed over projection body 204, and another anisotropic etch performed. This will, by etching into the substrate blank 202, cause projection body 204 to increase in relative height, and the point 206 to become finer and more needle-like. This process is repeated with a third (and subsequent) mask(s) 200", as required, until a sloping knife-edge 210 is created to extend longitudinally along substantially the entire length of projection body 204 to define projection 24, with knife-edge 210 beginning at the surface of substrate blank 202 at the narrow end of projection body 204 at what will become, after metallization, the surface of a contact pad 10, to the highest point of projection body 204. An oxidation process, with a similar series of masks, may also be employed in lieu of an etch process.

FIGS. 9A and 9B depict formation of projections 132 of contact pad 130 of FIGS. 5A and 5B, projections 134 being omitted for clarity, although formed in the same manner. Rectangular masking blocks 300 are formed at appropriate locations and spacings on silicon substrate blank 302. An anisotropic etch is then performed, as described above, until projections 132 of desired height are formed. An oxidization process, as described above, may also be employed in lieu of an etch process.

FIGS. 10A through 10D depict formation of the projections 172–176 of FIGS. 7A and 7B, two facing sets of such varied-level projections only being illustrated for clarity. A first set of masks 400 is formed on silicon substrate blank 402, and an anisotropic etch performed, commencing formation of the bodies of outermost, highest projections 172. A second set of masks 400' is then formed inwardly of masks 400, and another anisotropic etch performed to continue definition of projections 172 and initiate formation of intermediate projections 174. A third set of masks 400" is then formed inwardly of masks 400' and a third anisotropic etch performed to form knife-edged innermost projections 176 and to complete the formation and sharpening of projections 174 and 172. If the masks for the two sets of 90° rotationally-offset projections 172–176 have spaces left therebetween at corners as defined by adjacent ends of mutually-transverse projections 172–176, vent gaps as shown in FIG. 7A will be created. Again, an oxidization process may be employed to form projections 172–176 in lieu of an etch process.

If another substrate material, such as FR-4, is employed, dry etches may be employed to form the projections of the present invention.

Further, if one side of a projection is to be sloped while the other is substantially transverse to the substrate, an anisotropic etch may be performed to form facing sloped walls on the interior of a window defined in a mask, and then the etched window area masked to protect the sloped walls while an isotropic etch is performed about the periphery of the window.

While the various shapes, sizes and configurations of projections have been illustrated by specific embodiments, those skilled in the art will appreciate that various other shapes, sizes, and configurations of projections may form a contact structure without departing from the spirit of the invention or the scope of the appended claims. Thus, because variation of shapes, sizes and configurations for the projections could be employed, the projections illustrated herein are merely exemplary. Any shape, size and configuration may be employed, so long as the contact structure decreases or substantially eliminates deformation of the shape envelope of an associated solder ball or bump upon engagement with the contact structure and avoids the formation of closed or isolated cavities (gouges, pits) on the center of the solder ball adjacent the contact structure. It is also noted that different materials from those suggested may be selected for the contact pad and for the projections. Such materials may adapt the contact structure to effectively engage different types of solder balls depending on whether a temporary or permanent connection is desired.

In addition, the contact structure of this invention can be used to interconnect any semiconductor device having bumped bond pads with other external circuitry, using any known or conventional bumped die attach techniques. For example, the contact pads can be used to improve the connection between a flip-chip or bumped die and a probe card, test head or other temporary contact, or to a permanent chip carrier, such as a PCB or other carrier substrate. Thus, the contact structures according to the present invention can be utilized to make contact with bumped dice to characterize same as known-good-die (KGD), to test chip seal packages, to make temporary connections for other testing purposes, or to make permanent connections to external circuitry such as that contained in a PCB. For temporary or permanent connections, a carrier substrate may be made of ceramic, silicon, fiberglass, or other suitable materials, as previously noted. If it is desired to simultaneously probe all the dice of a wafer, a wafer-sized test head may be fabricated using the techniques previously discussed herein.

It is noted that the term "solder ball" as herein used is intended to be a generic term to describe the bumps of a bumped semiconductor device and is not intended to limit the material comprising the bumps to traditional tin/lead solder. The solder balls may be comprised of gold, aluminum or any other suitable conductive material known in the art. Preferably, the projections are formed of a harder material than the material of the solder ball to enhance penetration of the latter.

While the contact structures of the present invention have been described in terms of various preferred embodiments, it is understood that other forms could be adopted by one skilled in the art. Additionally, methods or techniques of forming the contact structures could differ from those suggested. Accordingly, it is understood that the scope of the invention is not to be limited except as otherwise set forth in the claims.

What is claimed is:

1. A carrier structure for at least one semiconductor device, comprising:
   a carrier substrate having a substantially planar surface including a plurality of contact pads arranged thereover in a pattern;
   a plurality of projections extending from each of said plurality of contact pads and having conductive projection surfaces thereon, the plurality of projections surrounding a substantially central, projection-devoid portion of each of said plurality of contact pads.

2. The carrier structure of claim 1, wherein said plurality of projections exhibit substantial knife edges at their outermost extents.

3. The carrier structure of claim 1, wherein said plurality of projections comprise elongated elements arranged to extend substantially radially from each said substantially central, projection-devoid portion and exhibiting longitudinally-extending substantial knife edges.

4. The carrier structure of claim 3, wherein at least a portion of each of said longitudinally-extending substantial knife edges lies at an acute angle to said substantially planar surface.

5. The carrier structure of claim 4, wherein said longitudinally-extending, substantial knife edges extend from each of said plurality of contact pads proximate said substantially central, projection-devoid portion and increase in elevation radially away therefrom.

6. The carrier structure of claim 5, wherein each of said plurality of projections of a given contact pad is substantially identical in configuration and dimensions.

7. The carrier structure of claim 1, wherein said plurality of projections of each of said plurality of contact pads defines a cradle for at least partially receiving a deformable conductive bump of a semiconductor device.

8. The carrier structure of claim 1, wherein said plurality of contact pads are conductive.

9. The carrier structure of claim 8, further comprising an insulating material interposed between said conductive projection surfaces and said carrier substrate.

10. The carrier structure of claim 9, wherein said plurality of projections and said plurality of contact pads comprise contiguous conductive surfaces, and said insulating material comprises an insulating layer interposed between said carrier substrate and said contiguous conductive surfaces.

11. The carrier structure of claim 10, wherein said plurality of projections comprise material of said carrier substrate, and said contiguous conductive surfaces comprise a layer of conductive material disposed over said carrier substrate.

12. The carrier structure of claim 8, wherein said plurality of projections comprise conductive material deposited over said plurality of conductive contact pads.

13. The carrier structure of claim 8, and further including conductive traces extending from at least some of said plurality of conductive contact pads.

14. The carrier structure of claim 1, wherein said plurality of projections comprise elongated elements arranged about each said substantially central, projection-devoid portion and exhibiting elongated substantial knife edges.

15. The carrier structure of claim 14, wherein said elongated substantial knife edges lie in substantially parallel relationship to said substantially planar surface.

16. The carrier structure of claim 15, wherein said plurality of projections are arcuate and substantially define circles about each substantially central, projection-devoid portion.

17. The carrier structure of claim 16, wherein ends of said elongated elements are in adjacent, non-abutting proximity.

18. The carrier structure of claim 15, wherein said plurality of projections substantially bound each said substantially central, projection-devoid portion.

19. The carrier structure of claim 18, wherein said plurality of projections comprise elongated linear elements defining at least one rectangular frame about said each substantially central, projection-devoid portion.

20. The carrier structure of claim 19, wherein ends of said elongated elements lie adjacent corners of said at least one rectangular frame in non-abutting mutual relationship.

21. The carrier structure of claim 19, wherein each of said plurality of projections is substantially identical in configuration and dimensions.

22. The carrier structure of claim 14, wherein said plurality of projections of each of said plurality of contact pads defines a cradle for at least partially receiving a deformable conductive bump of a semiconductor device.

23. The carrier structure of claim 22, wherein said plurality of projections of each contact pad of said plurality of contact pads is arranged in a plurality of groups about each said substantially central, projection-devoid portion, the projections of each of said groups lying a different distance from a center of each substantially central, projection-devoid portion.

24. The carrier structure of claim 23, wherein said projections of each group of said plurality of groups lie at substantially the same distance from said center as other projections of the same group of said plurality of groups.

25. The carrier structure of claim 23, wherein each group of projections associated with a contact pad extends above that pad a different distance than the projections of any other of said plurality of groups.

26. The carrier structure of claim 25, wherein said projections comprise elongated elements exhibiting elongated knife edges and having ends proximate other projections of the same group.

27. The carrier of structure of claim 26, wherein said projections are linear, and define a series of substantially concentric rectangular frames.

28. The carrier of structure of claim 26, wherein said projections are arcuate, and define a series of concentric, substantially circular frames.

29. The carrier structure of claim 24, wherein said groups of projections increase in height above said substantially planar surface with increased distance from said substantially central, projection-devoid portion.

30. The carrier structure of claim 24, wherein said projections comprise substantially symmetrical, pyramidal or conical elements extending above said substantially planar surface.

31. The carrier structure of claim 24, wherein said groups of projections increase in height above said substantially planar surface with increased distance from said substantially central, projection-devoid portion.

32. The carrier structure of claim 30, wherein at least some of said substantial symmetrical, pyramidal or conical elements include a flat outermost tip surface.

33. The carrier structure of claim 1, further comprising test probe tips mounted to said carrier substrate and supporting said plurality of contact pads thereon.

34. The carrier structure of claim 1, wherein at least one semiconductor device comprises a plurality of unsingulated dice in wafer form and said carrier substrate comprises a wafer-scale substrate carrying said plurality of contact pads thereon for simultaneous contact with said plurality of unsingulated semiconductor dice.

* * * * *